US010559584B2

(12) United States Patent
Choi et al.

(10) Patent No.: US 10,559,584 B2
(45) Date of Patent: Feb. 11, 2020

(54) SEMICONDUCTOR DEVICE INCLUDING A DIELECTRIC LAYER

(71) Applicants: Eun Yeoung Choi, Hwaseong-si (KR); Bio Kim, Seoul (KR); Young Wan Kim, Hwaseong-si (KR); Jung Ho Kim, Seongnam-si (KR); Young Seon Son, Hwaseong-si (KR); Jae Young Ahn, Seongnam-si (KR); Byong Hyun Jang, Suwon-si (KR)

(72) Inventors: Eun Yeoung Choi, Hwaseong-si (KR); Bio Kim, Seoul (KR); Young Wan Kim, Hwaseong-si (KR); Jung Ho Kim, Seongnam-si (KR); Young Seon Son, Hwaseong-si (KR); Jae Young Ahn, Seongnam-si (KR); Byong Hyun Jang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/426,797

(22) Filed: Feb. 7, 2017

(65) Prior Publication Data

US 2018/0012902 A1    Jan. 11, 2018

(30) Foreign Application Priority Data

Jul. 8, 2016   (KR) .......................... 10-2016-0086937

(51) Int. Cl.
*H01L 27/11582* (2017.01)
*H01L 21/28* (2006.01)
*H01L 29/423* (2006.01)

(52) U.S. Cl.
CPC .. *H01L 27/11582* (2013.01); *H01L 29/40117* (2019.08); *H01L 29/4234* (2013.01); *H01L 29/42368* (2013.01)

(58) Field of Classification Search
CPC .................................................. H01L 21/76831
See application file for complete search history.

(56) References Cited

U.S. PATENT DOCUMENTS

| 6,255,176 B1 | 7/2001 | Kim et al. |
| 6,849,513 B2 | 2/2005 | Tsujikawa et al. |
| 9,252,230 B2 | 2/2016 | Ko |
| 2010/0240207 A1 | 9/2010 | Park et al. |
| 2011/0147823 A1* | 6/2011 | Kuk .................. H01L 27/11551 257/324 |

(Continued)

FOREIGN PATENT DOCUMENTS

| KR | 10-2004-0059847 A | 7/2004 |
| KR | 10-0979233 B1 | 8/2010 |

(Continued)

*Primary Examiner* — Tucker J Wright
*Assistant Examiner* — Christopher A Culbert
(74) *Attorney, Agent, or Firm* — Myers Bigel, P.A.

(57) ABSTRACT

A semiconductor device including a dielectric layer is provided. The semiconductor device includes a stack structure, and a vertical structure within the stack structure. The vertical structure includes a lower region having a first width and an upper region having a second width, greater than the first width. The vertical structure further includes two dielectric layers of which respective ratios of lower thicknesses in the lower region to upper thicknesses in the upper region are different from each other.

20 Claims, 14 Drawing Sheets

(56) References Cited

U.S. PATENT DOCUMENTS

| | | | |
|---|---|---|---|
| 2012/0043673 A1* | 2/2012 | Chang | H01L 27/11551 257/786 |
| 2013/0126957 A1* | 5/2013 | Higashitani | H01L 27/11519 257/314 |
| 2014/0063935 A1* | 3/2014 | Park | H01L 27/1158 365/184 |
| 2015/0235836 A1 | 8/2015 | Go et al. | |
| 2015/0263034 A1 | 9/2015 | Higuchi et al. | |
| 2015/0279955 A1 | 10/2015 | Choi et al. | |
| 2015/0357413 A1 | 12/2015 | Zhang | |
| 2016/0064227 A1 | 3/2016 | Go et al. | |

FOREIGN PATENT DOCUMENTS

| | | |
|---|---|---|
| KR | 10-1075494 B1 | 10/2011 |
| KR | 10-2015-0113634 A | 10/2015 |
| KR | 10-1595790 B1 | 2/2016 |

\* cited by examiner

SEMICONDUCTOR DEVICE INCLUDING A DIELECTRIC LAYER

CROSS-REFERENCE TO RELATED APPLICATION

This application claims benefit of priority to Korean Patent Application No. 10-2016-0086937 filed on Jul. 8, 2016 in the Korean Intellectual Property Office, the disclosure of which is incorporated herein by reference in its entirety.

FIELD

Embodiments of the inventive concept relate to a semiconductor device including a dielectric layer and a method of manufacturing the same.

BACKGROUND

In the case of semiconductor devices, such as NAND flash memory and the like, the degree of integration thereof may be an important factor in determining the price of semiconductor products. To increase the integration thereof, memory cells arranged in a three-dimensional scheme have been proposed. However, as the degree of integration gradually increases, the distribution characteristics of memory cells disposed on different levels may be further degraded.

SUMMARY

Embodiments the inventive concept is to provide a semiconductor device in which cell distribution characteristics may be improved and a method of manufacturing the same.

According to an embodiment of the inventive concept a semiconductor device includes a stack structure, and a vertical structure within the stack structure. The vertical structure includes a lower region having a first width and an upper region having a second width, greater than the first width. The vertical structure further includes two dielectric layers of which respective ratios of lower thicknesses in the lower region to upper thicknesses in the upper region are different from each other.

According to an embodiment of the inventive concept, a semiconductor includes conductive patterns and interlayer insulating layers alternately stacked on a substrate. A hole penetrates through the conductive patterns and the interlayer insulating layers. A vertical structure is disposed in the hole. The vertical structure includes a lower region and an upper region on the lower region, the upper region having a width greater than a width of the lower region. The vertical structure includes a semiconductor layer and a dielectric structure adjacent to the conductive patterns. The dielectric structure includes a layer of which a lower thickness in the lower region that is greater than an upper thickness in the upper region.

According to an embodiment of the inventive concept, a semiconductor device includes a stack structure on a substrate having an opening formed therein. A vertical structure is in the opening and comprises a multi-layer dielectric structure. Each of the layers comprising the dielectric structure has an upper region and a lower region, the lower region being between the upper region and the substrate. A first ratio of a thickness of the lower region to a thickness of the upper region for a first one of the layers is different from a second ratio of a thickness of the lower region to a thickness of the upper region for a second one of the layers.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
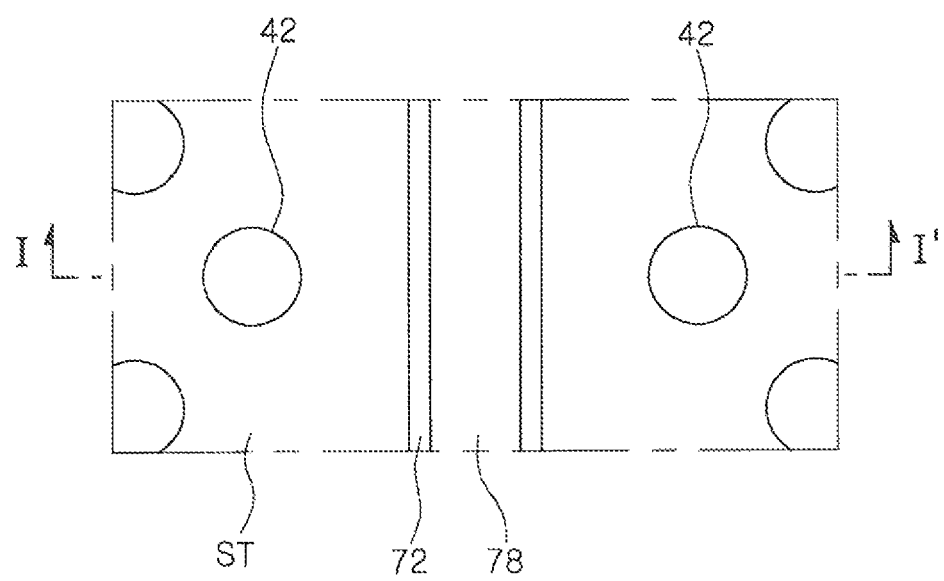
FIG. 1 is a plan view of a semiconductor device according to an example embodiment of the inventive concept.

Hereinafter, a semiconductor device according to an example embodiment will be described with reference to FIGS. 1 to 3. FIG. 1 is a plan view of a semiconductor device according to an example embodiment, FIG. 2 is a cross-sectional view illustrating a region taken along line I-I' of FIG. 1, and FIG. 3 is a partially enlarged view illustrating constituent elements of FIG. 2.

Figure 2:
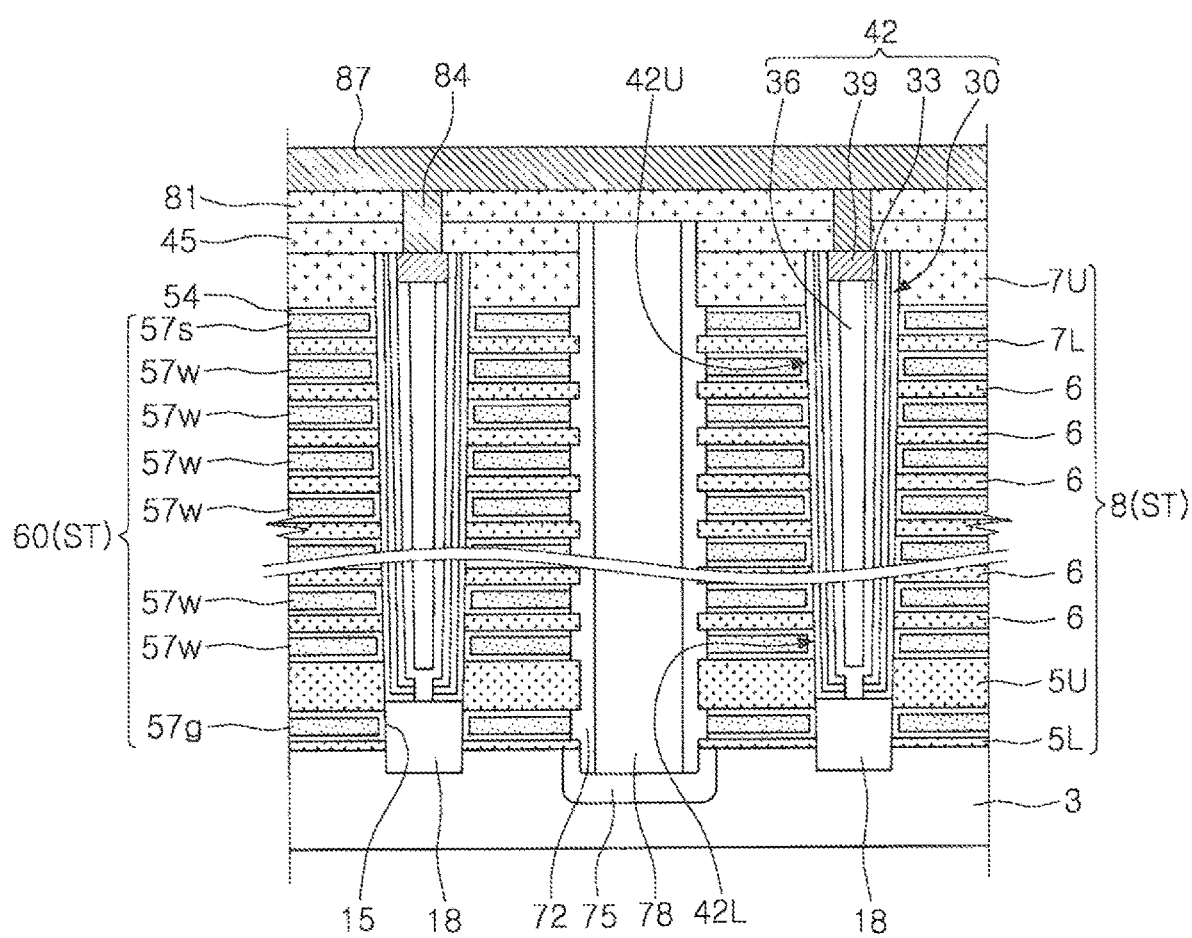
FIG. 2 is a cross-sectional view of a semiconductor device according to an example embodiment of the inventive concept.
Figure 3:
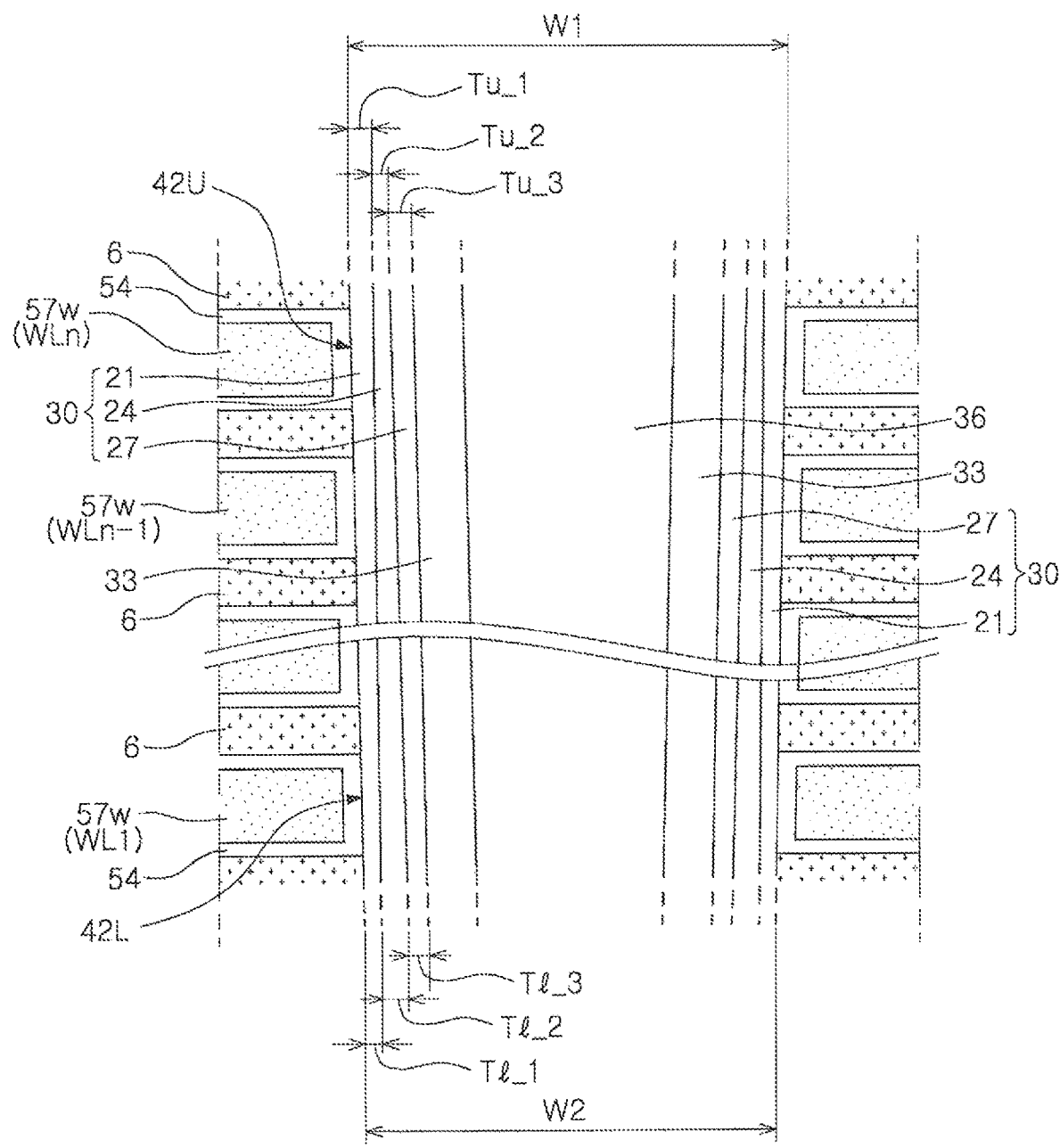
FIG. 3 is a partially enlarged view of a semiconductor device according to an example embodiment of the inventive concept.

With reference to FIGS. 1, 2 and 3, a substrate 3 may be provided. The substrate 3 may be a semiconductor substrate formed of a semiconductor material, such as silicon or the like. The substrate 3 may be a single-crystal semiconductor substrate. However, example embodiments of the inventive concept are not limited thereto. For example, the substrate 3 may be a polycrystalline semiconductor substrate.

A stack structure ST may be disposed on the substrate 3. The stack structure ST may include interlayer insulating layers 8 and conductive patterns 60. The conductive patterns 60 may be interposed between the interlayer insulating layers 8. The interlayer insulating layers 8 and the conductive patterns 60 may be alternately and repetitively stacked on the substrate 3.

In an example, the conductive patterns 60 may include select gate electrodes 57s and 57g, and cell gate electrodes 57w.

Between the select gate electrodes 57s and 57g, a lowermost select gate electrode 57g may be a ground select gate electrode or a ground select line (GSL), and an uppermost select gate electrode 57s may be a string select gate electrode or a string select line (SSL).

The cell gate electrodes 57w may be disposed between the uppermost select gate electrode 57s and the lowermost select gate electrode 57g. The cell gate electrodes 57w may be word lines WL1, . . . , WLn−1, and WLn of a memory cell array. The cell gate electrodes 57w may be spaced apart from each other and, may be arranged in a direction perpendicular to an upper surface of the substrate 3.

The interlayer insulating layers 8 may include a first lower interlayer insulating layer 5L between the lowermost select gate electrode 57g and the substrate 3, a second lower interlayer insulating layer 5U between the lowermost select gate electrode 57g and a lowermost cell gate electrode among the cell gate electrodes 57w, intermediate interlayer insulating layers 6 between the cell gate electrodes 57w, a first upper interlayer insulating layer 7L between an uppermost cell gate electrode among the cell gate electrodes 57w and the uppermost select gate electrode 57s, and a second upper interlayer insulating layer 7U above the uppermost select gate electrode 57s. The second lower interlayer insulating layer 5U may have a thickness greater than a thickness of each of the intermediate interlayer insulating layers 6.

A hole 15 may penetrate through the stack structure ST. A vertical structure 42 may be disposed in the hole 15. In an example, the vertical structure 42 may penetrate through the stack structure ST. The vertical structure 42 may include an upper region 42U having a first width W1 and a lower region 42L having a second width W2 less than the first width W1.

In an example, the upper region 42U of the vertical structure 42 may be adjacent to an uppermost cell gate electrode WLn (FIG. 3) among the cell gate electrodes 57w, and the lower region 42L of the vertical structure 42 may be adjacent to a lowermost cell gate electrode WL1 (FIG. 3) among the cell gate electrodes 57w.

In example embodiments, the upper region 42U and the lower region 42L of the vertical structure 42 are terms to explain relative positions, and, thus, are not limited to these terms. For example, the upper region 42U and the lower region 42L of the vertical structure 42 indicated by arrows in FIG. 2 are not limited to the portions illustrated by the arrows in FIG. 2. For example, in the vertical structure 42, the upper region 42U may indicate a portion relatively distant from the substrate 3 as compared to a position of the lower region 42L therefrom.

The vertical structure 42 may include a semiconductor layer 33 and a dielectric structure 30 between the semiconductor layer 33 and the stack structure ST.

The dielectric structure 30 may include a first dielectric layer 21, a second dielectric layer 24, and a third dielectric layer 27. The second dielectric layer 24 may be disposed between the first dielectric layer 21 and the third dielectric layer 27. The second dielectric layer 24 may be in contact with the first and third dielectric layers 21 and 27. The first dielectric layer 21 may be adjacent to the stack structure ST and the third dielectric layer 27 may be adjacent to the semiconductor layer 33.

In an example, the dielectric structure 30 may include a layer of which a lower thickness in the lower region 42L is greater than an upper thickness in the upper region 42U. For example, in the ease of the second dielectric layer 24 of the dielectric structure 30, a lower thickness Tl_2 thereof in the lower region may be greater than an upper thickness Tu_2 thereof in the upper region.

In an example, the vertical structure 42 may include two layers of which ratios of lower thicknesses in the lower region 42L to upper thicknesses in the upper region 42U are different from each other. The vertical structure 42 may include a layer of which a ratio of a lower thickness in the lower region 42L to an upper thickness thereof in the upper region 42L is greater than 1 and a layer of which a ratio of a lower thickness in the lower region 42L to an upper thickness thereof in the upper region 42U is less than 1. For example, a layer, in which a ratio of a lower thickness in the lower region 42L to an upper thickness thereof in the upper region 42U is greater than 1, may be the second dielectric layer 24, and a layer, in which a ratio of a lower thickness in the lower region 42L to an upper thickness thereof in the upper region 42U is less than 1, may be one or both of the first and third dielectric layers 21 and 27. For example, in the case of the second dielectric layer 24 of the dielectric structure 30, the lower thickness Tl_2 thereof in the lower region 42L, may be greater than the upper thickness Tu_2 thereof in the upper region 42U, and in the case of one or both oldie first and third dielectric layers 21 and 27 of the dielectric structure 30, lower thicknesses Tl_1 and Tl_3 thereof in the lower region 42L may be less than upper thicknesses Tu_1 and Tu_3 thereof in the upper region 42U. Thus, a ratio of the lower thickness Tl_2 of the second dielectric layer 24 to the upper thickness Tu_2 thereof may be different from ratios of lower thicknesses Tl_1 or/and Tl_3 of one or both of the first and third dielectric layers 21 and 27 to the upper thicknesses Tu_1 or/and Tu_3 thereof.

In an example, the vertical structure 42 may further include a core pattern 36 and a pad 39 provided on the core pattern 36. A side and a bottom surface of the core pattern 36 may be covered with the semiconductor layer 33. The core pattern 36 may be formed of an insulating material, for example, silicon oxide. The pad 39 may be formed of a conductive material, for example, polysilicon having N-type conductivity.

In an example, a semiconductor pattern 18 may be disposed in the hole 15. The semiconductor pattern 18 may be disposed below the vertical structure 42. The semiconductor pattern 18 may be an epitaxial layer formed through a growth thereof on the substrate 3 using a selective epitaxial growth (SEG) process. The semiconductor pattern 18 may be connected to the semiconductor layer 33 while being disposed below the semiconductor layer 33.

Fourth, dielectric layers 54, which may extend between the conductive patterns 60 and the dielectric structure 30 while being interposed between the conductive patterns 60 and the interlayer insulating layers 6, may be provided. The fourth dielectric layers 54 may configure a blocking dielectric portion together with the first dielectric layer 21. Alternatively, the first dielectric layer 21 may be a barrier dielectric layer, and the fourth dielectric layer 54 may be a blocking dielectric layer.

The first dielectric layer 21 may be formed of a dielectric material having an energy bandgap greater than an energy bandgap of a high-K dielectric material, for example, silicon oxide. The fourth dielectric layer 54 may be formed of a high-K dielectric material, for example, hafnium oxide or aluminum oxide.

The second dielectric layer 24 may be an information storage layer. The second dielectric layer 24 may be a charge trapping layer that traps charge to store information therein. The third dielectric layer 27 may be a tunnel oxide layer. The third dielectric layer 27 may be formed of silicon oxide or a silicon oxide-based dielectric material.

The second dielectric layer 24, usable as the information storage layer, may be formed of a material capable of trapping and retaining electrons injected from the semiconductor layer 33 through the third dielectric layer 27 usable as the tunnel oxide layer or of eliminating the trapped electrons from the second dielectric layer 24, according to operating conditions of a memory device. For example, the second dielectric layer 24 may be formed of silicon nitride. However, example embodiments of the inventive concept are not limited thereto. For example, the second dielectric layer 24 may be formed of silicon oxynitride (SiON).

A first upper insulating layer 45 may be disposed on the stack structure ST and the vertical structure 42. The first upper insulating layer 45 may be formed of an insulating material, such as silicon oxide or the like.

A separation pattern 78 may be disposed on the substrate 3. The separation pattern 78 may penetrate through the first upper insulating layer 45 and the stack structure ST. In an example, the separation pattern 78 may be formed of a conductive material. An insulating spacer 72 may be disposed between the stack structure ST and the separation pattern 78.

An impurity region 75 may be disposed in the substrate 3, below the separation pattern 78. The impurity region 75 may have a different conductivity-type from that of the substrate 3 adjacent to the impurity region 75. For example, the impurity region 75 may have N-type conductivity, while the substrate 3 may have P-type conductivity in a region thereof adjacent to the impurity region 75.

In an example, the impurity region 75 and the pad 39 may have the same conductivity type. For example, the impurity region 75 and the pad 39 may have N-type conductivity. The pad 39 may be a drain region and the impurity region 75 may be a source region.

In an example, in the case of the vertical structure 42, a plurality of vertical structures 42 may be provided, and may be disposed on both sides of the separation pattern 78.

A second upper insulating layer 81 may be disposed on the first upper insulating layer 45 and the separation pattern 78. A contact plug 84, that may be electrically connected to the pad 39 of the vertical structure 42 while penetrating through the first and second upper insulating layers 45 and 81, may be provided. A bit line 87 electrically connected to the contact plug 84 may be disposed on the second upper insulating layer 81.

According to example embodiments, the cell gate electrodes 57w arranged on the substrate 3 in a direction perpendicular to an upper surface of the substrate 3 may be the word lines WL1, . . . , WLn−1, and WLn, and the vertical substrate 42 extended in a direction perpendicular to an upper surface of the substrate 3 may include the semiconductor layer 33 usable as a channel of a cell transistor and the dielectric structure 30 including a charge trapping layer trapping a charge to store information therein. The constituent elements may be combined to comprise a NAND flash memory device.

According to example embodiments, an upper width W1 (FIG. 3) of the upper region 42U of the vertical structure 42 adjacent to an uppermost word line WLn among the word lines WL1, . . . , WLn−1, and WLn (see FIG. 3) may be greater than a lower width W2 of the lower region 42L of the vertical structure 42 adjacent to a lowermost word line WL among the word lines WL1, . . . , WLn−1, and WLn (see FIG. 3). In addition, the dielectric structure 30 may include at least two dielectric layers of which thickness ratios are different from each other. For example, the dielectric structure 30 of the vertical structure 42 may include two dielectric layers of which ratios of lower thicknesses in the lower region 42L to upper thicknesses in the upper region 42U are different from each other.

As one of the dielectric layers of the dielectric structure 30, for example, the second dielectric layer 24 is formed at a thickness ratio different from that of another layer, for example, the first dielectric layer 21, cell distribution characteristics of a three-dimensional memory cell array including, the vertical structure 42 of which upper and lower widths are different and the word lines WL1, . . . , WLn−1, and WLn arranged in a direction perpendicular to an upper surface of the substrate 3, may be improved.

Figure 4:
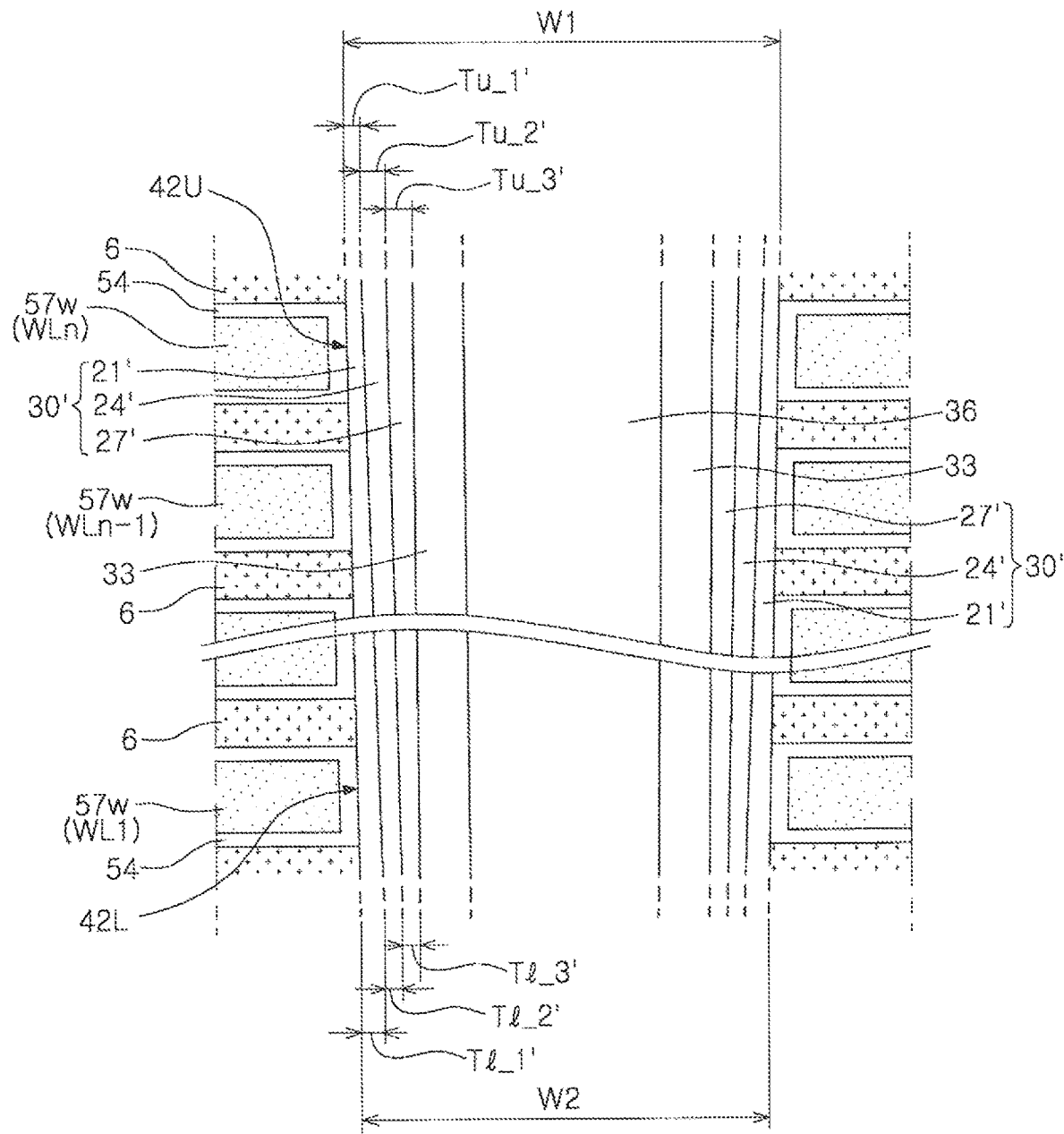
FIG. 4 is a partially enlarged view illustrating a modified example of a semiconductor device according to an example embodiment of the inventive concept.

According to an example embodiment, the dielectric structure 30 of the vertical structure 42 may include a plurality of layers, and any one of the plurality of layers may have a lower thickness in the lower region 42L greater than an upper thickness in the upper region 42U. As illustrated in FIG. 3, an example layer in which a lower thickness in the lower region 42L is greater than an upper thickness in the upper region 42U may be the second dielectric layer 24 of the dielectric structure 30, but is not limited thereto. A modified example of the dielectric structure 30 will be described below with reference to FIG. 4. FIG. 4 is a view illustrating a modified example of the dielectric structure 30 of FIG. 3.

With reference to FIGS. 1, 2 and 4, a dielectric structure 30' may include a first dielectric layer 21' adjacent to the stack structure ST, a third dielectric layer 27' adjacent to the semiconductor layer 33, and a second dielectric layer 24' between the first and third dielectric layers 21' and 27'.

In the case of the first dielectric layer 21' of the dielectric structure 30', a ratio of a lower thickness thereof in the lower region 42L to an upper thickness thereof in the upper region 42U may be greater than 1, and in the case of one or both of the second and third dielectric layers 24' and 27' of the dielectric structure 30', ratios of lower thicknesses thereof in the lower region 42L to upper thicknesses thereof in the upper region 42U may be less than 1. Thus, the first dielectric layer 21' may have a lower thickness Tl_1' in the lower region 42L, greater than an upper thickness Tu_1' in the upper region 42U, and one or both of the second and third dielectric layers 24' and 27' may have lower thicknesses Tl_2' in the lower region 42L less than upper thicknesses Tu_2' in the upper region 42U.

Figure 5:
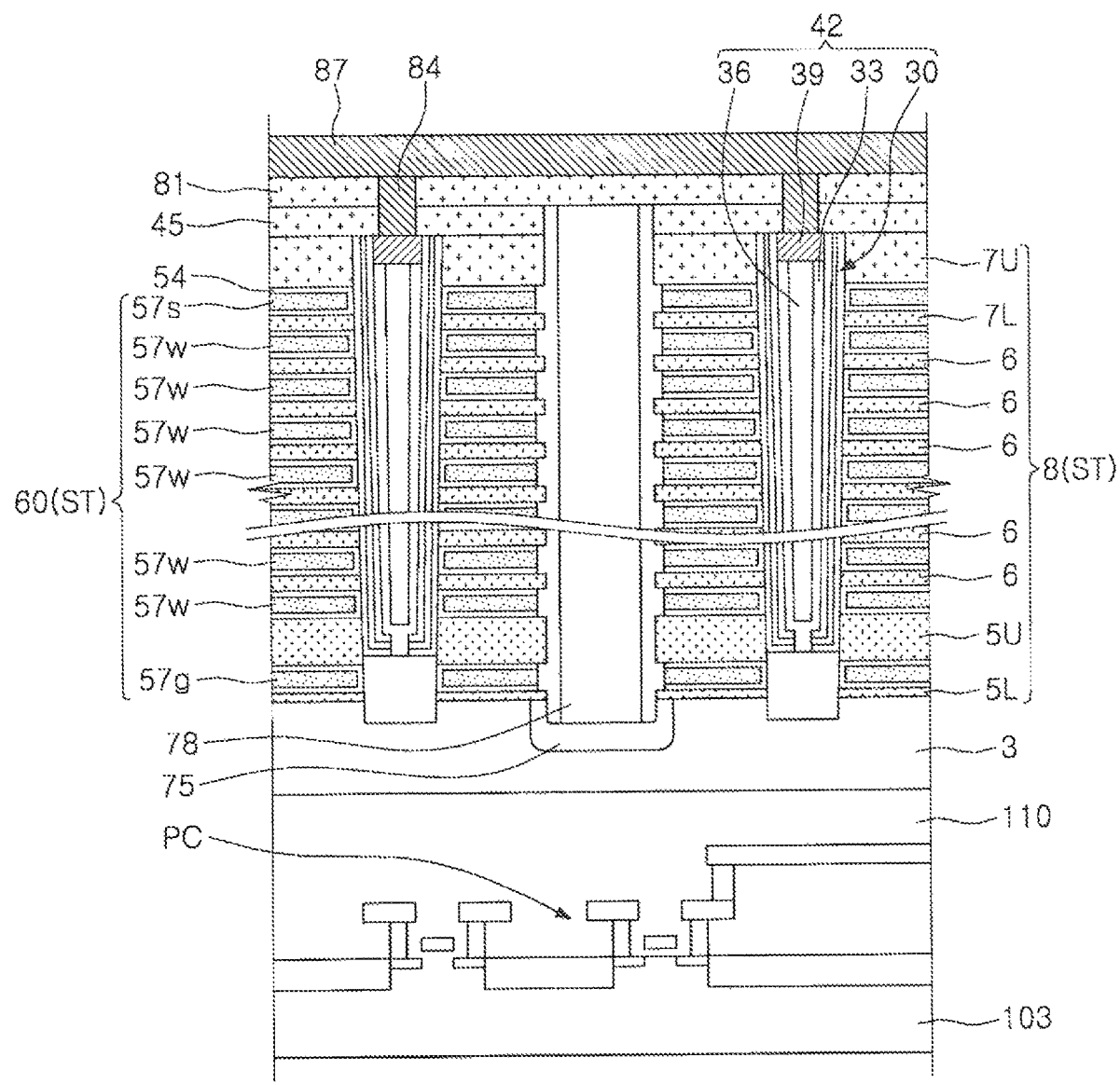
FIG. 5 is a cross-sectional view illustrating a modified example of a semiconductor device according to an example embodiment of the inventive concept.

According to an example embodiment, the conductive patterns 60, the vertical structure 42, the bit line 87, and the impurity region 75 above the substrate 3 may comprise a memory cell array region. A peripheral circuit region electrically connected to the memory cell array region may be disposed below the memory cell array region. For example, as illustrated in FIG. 5, a peripheral circuit region PC may be disposed between a base region 103 and the substrate 3. The base 103 may be a semiconductor substrate. The peripheral circuit region PC may be covered by a lower insulating layer 110 between the base 103 and the substrate 3.

Figure 6:
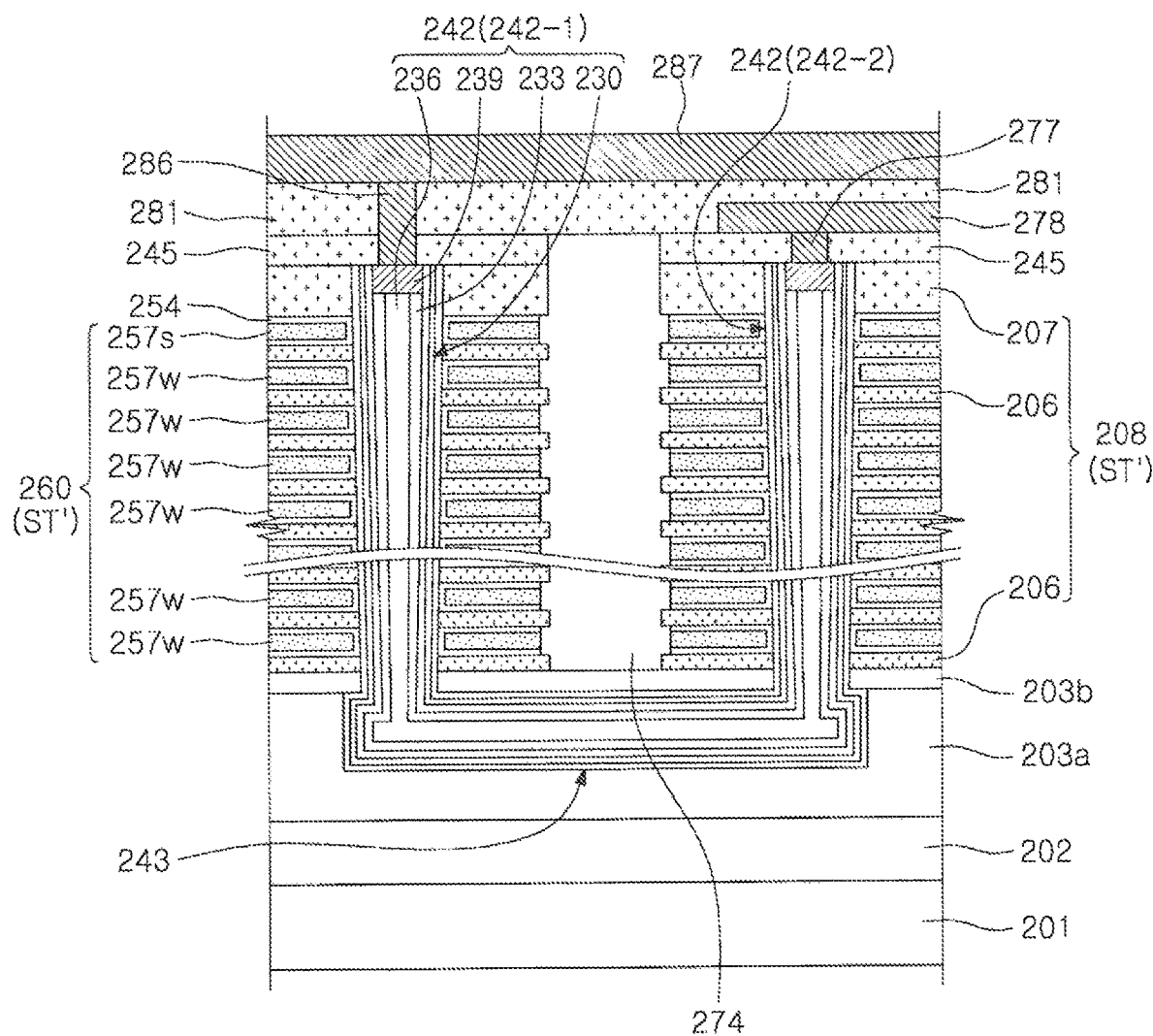
FIG. 6 is a cross-sectional view illustrating a modified example of a semiconductor device according to an example embodiment of the inventive concept.

According to an example embodiment, the vertical structure 42 may be provided as a plurality of vertical structures and the plurality of vertical structures may be spaced apart from each other, but is not limited thereto. An example of a semiconductor device including a plurality of vertical structures 242 connected to each other will be described below with reference to FIGS. 6 and 7. FIG. 6 is a cross-sectional view illustrating a modified example of the semiconductor device according to the example embodiment, and FIG. 7 is a partially enlarged view illustrating constituent elements of FIG. 6.

Figure 7:
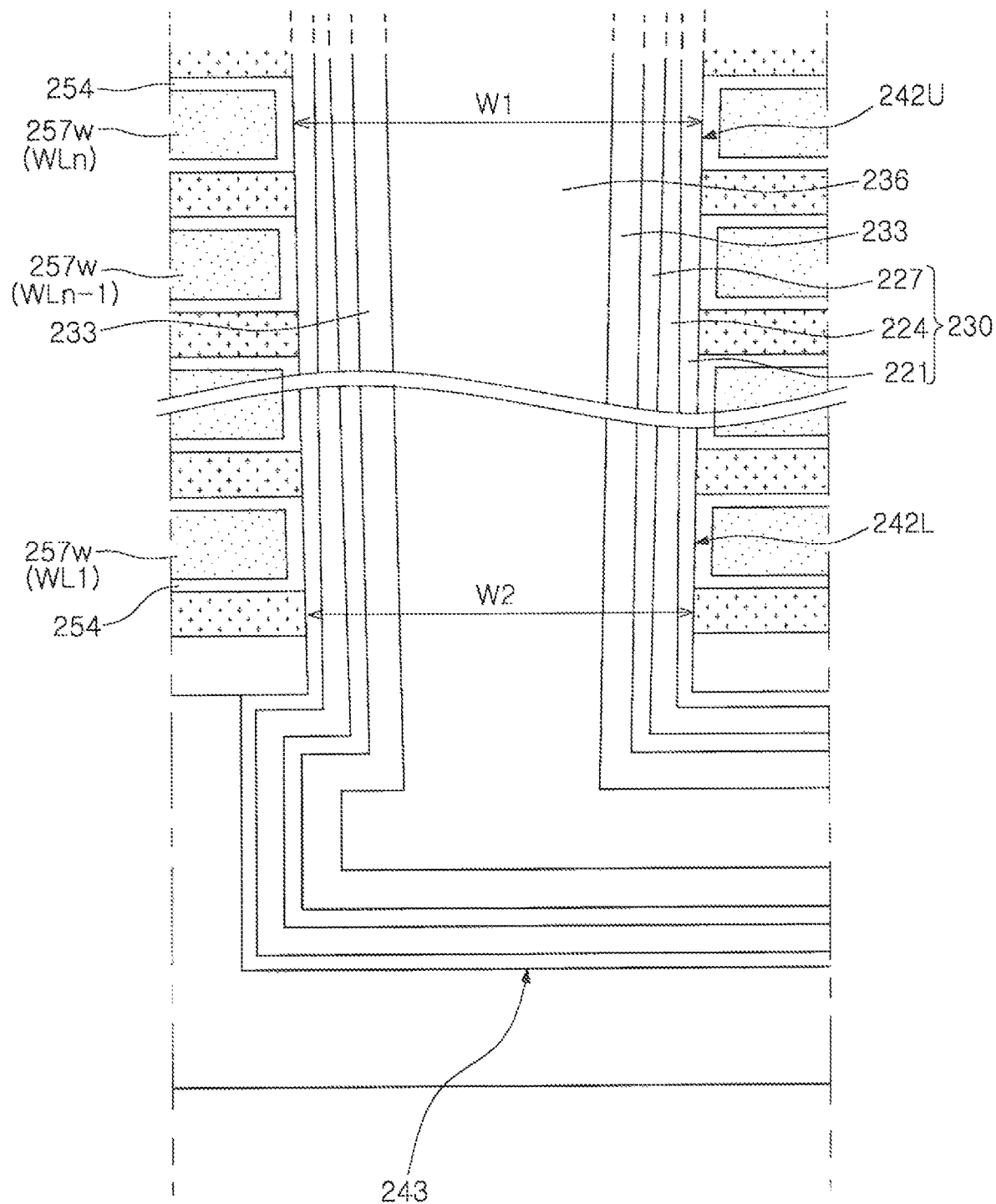
FIG. 7 is a cross-sectional view illustrating a modified example of a semiconductor device according to an example embodiment of the inventive concept.

With reference to FIGS. 6 and 7, an insulating layer 202 may be disposed on a substrate 201. A first backgate electrode layer 203a and a second backgate electrode layer 203b may be sequentially disposed on the insulating layer 202.

Stack structures ST' spaced apart from each other may be disposed on the second backgate electrode layer 203b. The stack structures ST' may include interlayer insulating layers 208 and conductive patterns 260 alternately stacked on each other. The interlayer insulating layers 208 may include lower interlayer insulating layers 206 and an upper interlayer insulating layer 207 on the lower interlayer insulating layers 206. The upper interlayer insulating layer 207 may have a thickness greater than a thickness of each of the upper interlayer insulating layers 206. The conductive patterns 260 may be interposed between the interlayer insulating layers 208.

An uppermost conductive pattern 257s among the conductive patterns 260 may be a gate electrode. Conductive patterns 257w below the uppermost conductive pattern 257s among the conductive patterns 260 may be cell gate electrodes or word lines.

A first upper insulating layer 245 and a second upper insulating layer 281 may be sequentially stacked on the stack structures ST'.

A separation pattern 274 penetrating through the first upper insulating layer 245 and the stack structures ST' may be provided. The separation pattern 274 may be formed of an insulating material, such as silicon oxide or the like.

Vertical structures 242 penetrating through the stack structures ST' may be provided. The vertical structures 242 may include a first vertical structure 242_1 and a second vertical structure 242_2 opposing each other with the separation pattern 274 therebetween.

The first and second vertical structures 242_1 and 242_2 may be connected to each other via a connection portion 243 that extends from lower portions of the first and second vertical structures 242_1 and 242_2 in a horizontal direction. The connection portion 243 may be embedded in the first and second backgate electrode layers 203a and 203b, and may connect lower regions of the first and second vertical structures 242_1 and 242_2 to each other.

The first and second vertical structures 242_1 and 242_2, and the connection portion 243 may include a core pattern 236, a semiconductor layer 233, a dielectric structure 230, and pads 239.

In the case of the first and second vertical structures 242_1 and 242_2 and the connection portion 243, the core patterns 236 may penetrate through the stack structures ST' and may be connected to each other below the stack structures ST' and the separation pattern 274. The pads 239 may be connected to the semiconductor layers 233 while being disposed in upper regions of the first and second vertical structures 242_1 and 242_2. The pads 239 may be formed of polysilicon having N-type conductivity.

The bit line 287 may be disposed on the second upper insulating layer 281. A bit line contact plug 286 may be disposed between the bit line 287 and the first vertical structure 242_1. A source line 278 may be disposed on the first upper insulating layer 245. A source contact plug 277 may be disposed between the source line 278 and the second vertical structure 242_2.

In an example, the cell gate electrodes 257w may include n number of word lines WL1, . . . , WLn−1, and WLn arranged in a vertical direction.

In an example, the dielectric structure 230 of the first and second vertical structures 242_1 and 242_2 may respectively correspond to the first dielectric layer 21, the second dielectric layer 24, and the third dielectric layer 27 illustrated in FIG. 3, and may include a first dielectric layer 221, a second dielectric layer 224, and a third dielectric layer 227 that extend to the connection portion 243. Thicknesses and a material of the first to third dielectric layers 221, 224, and 227 may be substantially identical to those of the first to third dielectric layers 21, 24, and 27 (see FIG. 3), and, thus, a detailed description thereof will be omitted. For example, in three case of the second dielectric layer 224, an upper thickness thereof in an upper region may be lower than a lower thickness thereof in a lower region in the same manner as the second dielectric layer 24 of FIG. 3. In addition, the second dielectric layer 224 may extend into the connection portion 243, and a thickness of the second dielectric layer 224 in the connection portion 243 may be greater than an upper thickness of the second dielectric layer 224 in the upper region. In a manner similar thereto, for example, in the same manner as the first dielectric layer 21 described above with reference to FIG. 3, an upper thickness of the first dielectric layer 221 in the upper region may be greater than a lower thickness thereof in the lower region. In addition, the first dielectric layer 221 may extend into the connection portion 243, and a thickness of the first dielectric layer 221 in the connection portion 243 may be less than an upper thickness of the first dielectric layer 221 in the upper region.

Figure 8:
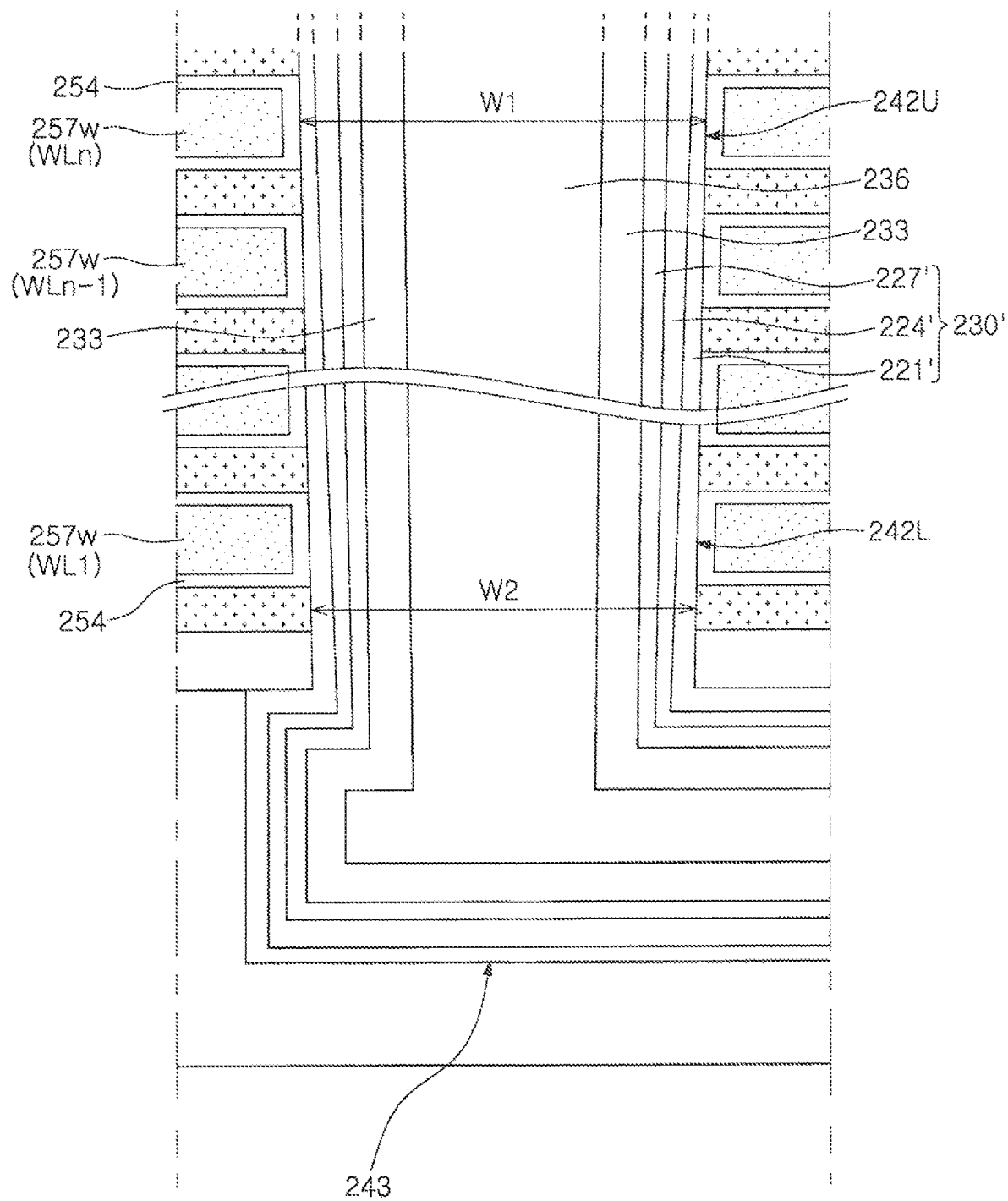
FIG. 8 is a cross-sectional view illustrating a modified example of a semiconductor device according to an example embodiment of the inventive concept.

The dielectric structure 230 may be modified as illustrated in FIG. 8. For example, a modified dielectric structure 230' as illustrated in FIG. 8 may include a first dielectric layer 221', a second dielectric layer 224', and a third dielectric layer 227' respectively corresponding to the first dielectric layer 21', the second dielectric layer 24', and the third dielectric layer 27' illustrated in FIG. 4 and extending to the connection portion 243. Thicknesses and a material of the first to third dielectric layers 221', 224', and 227' may be substantially identical to those of the first to third dielectric layers 21', 24', and 27' (see FIG. 4), and, thus, a detailed description thereof will be omitted.

Next, an example of a method of manufacturing the semiconductor device as described above with reference to FIGS. 1 to 3 will be described below with reference to FIGS. 9A to 9F. FIGS. 9A to 9F are cross-sectional views taken along line I-I of FIG. 1.

Figure 9A:
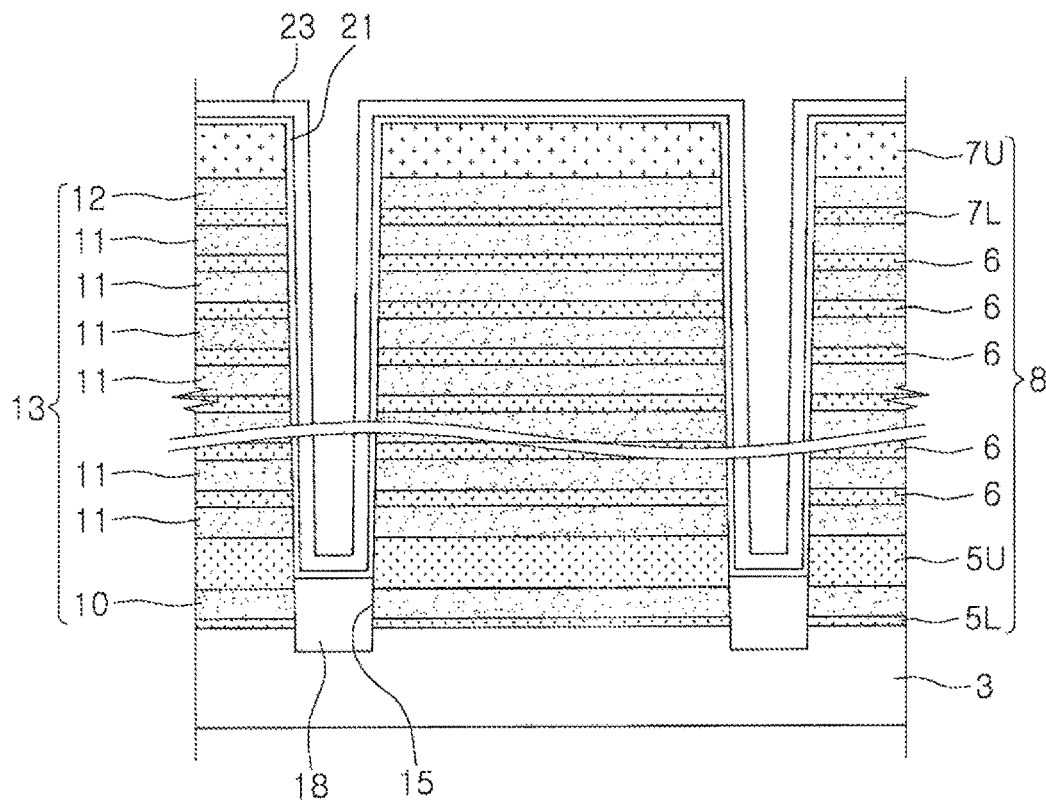
FIGS. 9A to 9F are cross-sectional views illustrating an example of a method of manufacturing a semiconductor device according to an example embodiment of the inventive concept.

With reference to FIGS. 1 and 9A, a substrate 3 may be provided. The substrate 3 may be a semiconductor substrate. The substrate 3 may be a single-crystal silicon substrate or a polysilicon substrate.

Interlayer insulating layers 8 and sacrificial layers 13 may be formed to be alternately and repetitively stacked on the substrate 3. The interlayer insulating layers 8 may be formed of a material having etch selectivity with respect to the sacrificial layers 13. For example, the interlayer insulating layers 8 may be formed of silicon oxide, and the sacrificial layers 13 may be formed of silicon nitride.

The interlayer insulating layers 8 may include a first lower interlayer insulating layer 5L, a second lower interlayer insulating layer 5U on the first lower interlayer insulating layer 5L, a plurality of intermediate interlayer insulating layers 6 on the second lower interlayer insulating layer 5U, a first upper interlayer insulating layer 7L on the intermediate interlayer insulating layers 6, and a second upper interlayer insulating layer 7U on the first upper interlayer insulating layer 7L.

In an example, the second lower interlayer insulating layer 5U may have a thickness greater than a thickness of each of the intermediate interlayer insulating layers 6. The second upper interlayer insulating layer 7U may have a thickness greater than a thickness of each of the intermediate interlayer insulating layers 6.

The sacrificial layers 13 may have a substantially identical thickness. The sacrificial layers 13 may include a lower sacrificial layer 10 between the first lower interlayer insulating layer 5L and the second lower interlayer insulating layer 5U, an upper sacrificial layer 12 between the first and second upper interlayer insulating layers 7L and 7U, and intermediate sacrificial layers 11 between the lower sacrificial layer 10 and the upper sacrificial layer 12.

A hole 15 penetrating through the interlayer insulating layers 8 and the sacrificial layers 13 may be formed. The hole 15 may be provided as a plurality of holes, and may allow the substrate 3 to be exposed.

The hole 15 may extend into the substrate 3 while penetrating through the interlayer insulating layers 6 and the sacrificial layers 12. An upper width of the hole 15 may be greater than a lower width thereof.

In an example, a semiconductor pattern 18 may be formed in a lower region of the hole 15 using an SEG process. The semiconductor pattern 18 may be a silicon epitaxial layer.

In an example, a level of an upper surface of the semiconductor pattern 18 may be higher than a level of a lower surface of the second lower interlayer insulating layer 5U and may be lower than a level of an upper surface of the second lower interlayer insulating layer 5U.

A first dielectric layer 21 may be formed on the substrate including the hole 15 and the semiconductor pattern 18. The first dielectric layer 21 may be formed of an insulating material, such as silicon oxide or the like.

In an example, the first dielectric layer 21 may have an increased thickness increased away from the substrate 3. The first dielectric layer 21 may have a thickness reduced in a direction from an upper portion toward a lower portion thereof.

A second preliminary dielectric layer 23 may be formed on the first dielectric layer 21. The second preliminary dielectric layer 23 may have a thickness reduced in a direction from an upper portion toward a lower portion thereof. The second preliminary dielectric layer 23 may be formed of a single material capable of trapping a charge, such as, for example, silicon nitride (SiN) or silicon oxynitride (SiON).

Figure 9B:
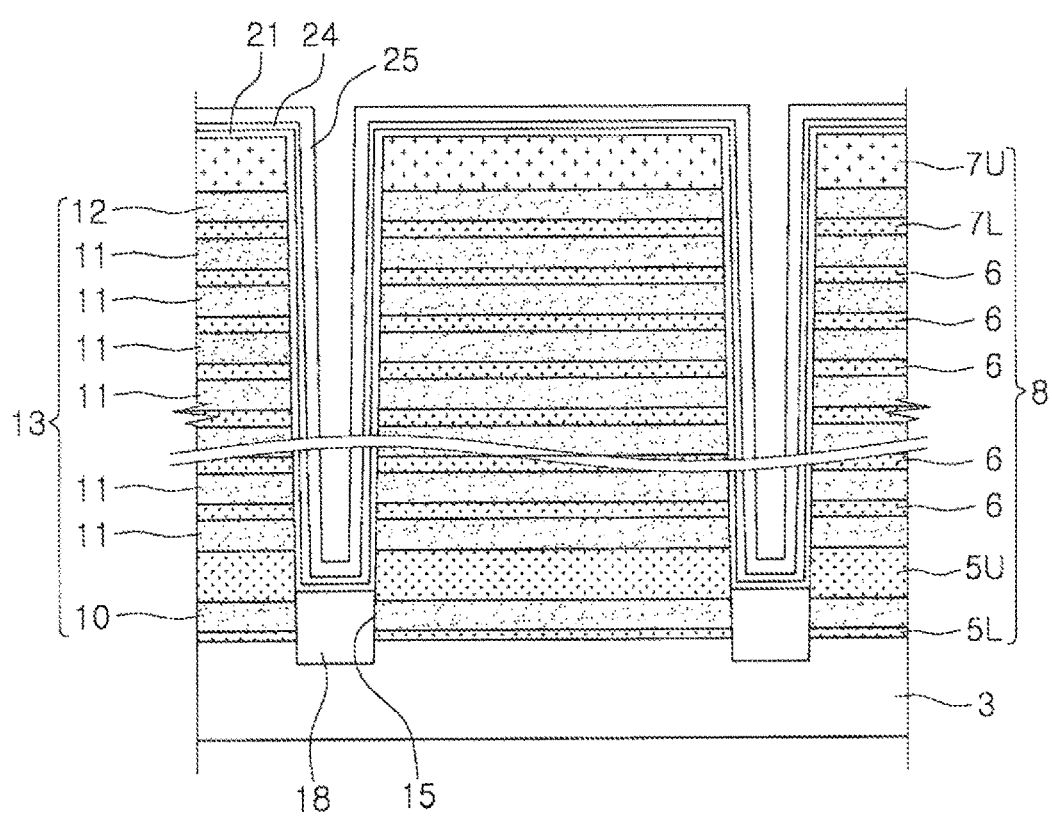

With reference to FIGS. 1 and 9B, the second preliminary dielectric layer 23 (see FIG. 9A) may be oxidized to form a sacrificial insulating layer 25, and a second dielectric layer 24 having a thickness having been relatively reduced as compared to that of the second preliminary dielectric layer 23 (FIG. 9A) may be formed. The oxidation of the second preliminary dielectric layer 23 (see FIG. 9A) may be performed using a radical oxidation process or a plasma oxidation process.

A ratio of upper thickness/lower thickness of the second dielectric layer 24 may be different from a ratio of upper thickness/lower thickness of the second preliminary dielectric layer 23 (see FIG. 9A). For example, the second preliminary dielectric layer 23 (FIG. 9A) may have a decreasing thickness in a direction from an upper portion toward a lower portion thereof, and the second dielectric layer 24 may have an increasing thickness in a direction from an upper portion toward a lower portion thereof. The second dielectric layer 24 may have a lower thickness Tl_2 (FIG. 3) in the lower region, greater than an upper thickness Tu_2 (FIG. 3) in the upper region as illustrated in FIG. 3. The sacrificial insulating layer 25 may have a decreasing thickness in a direction from an upper portion toward a lower portion thereof.

Figure 9C:
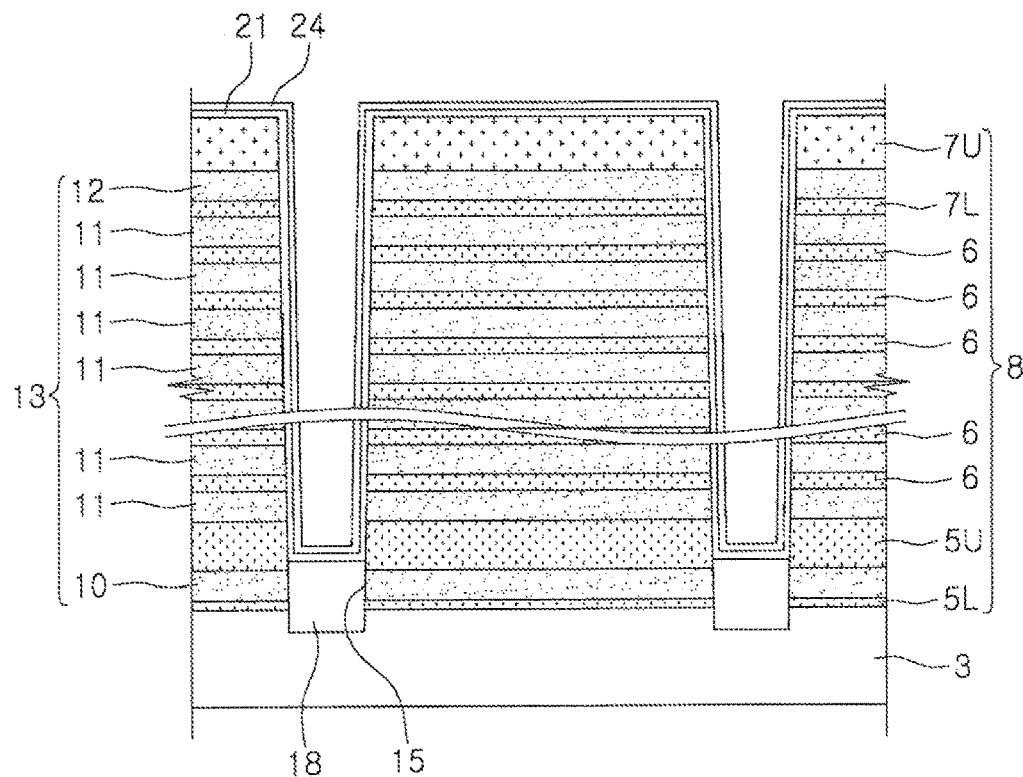

With reference to FIGS. 1 and 9C, an etching process may be performed to selectively remove the sacrificial insulating layer 25. For example, when the second dielectric layer 24 is formed of silicon nitride and the sacrificial insulating layer 25 is formed of silicon oxide, the sacrificial insulating layer 25 may be selectively removed via a wet etching process using a diluted hydrofluoric acid solution.

Figure 9D:
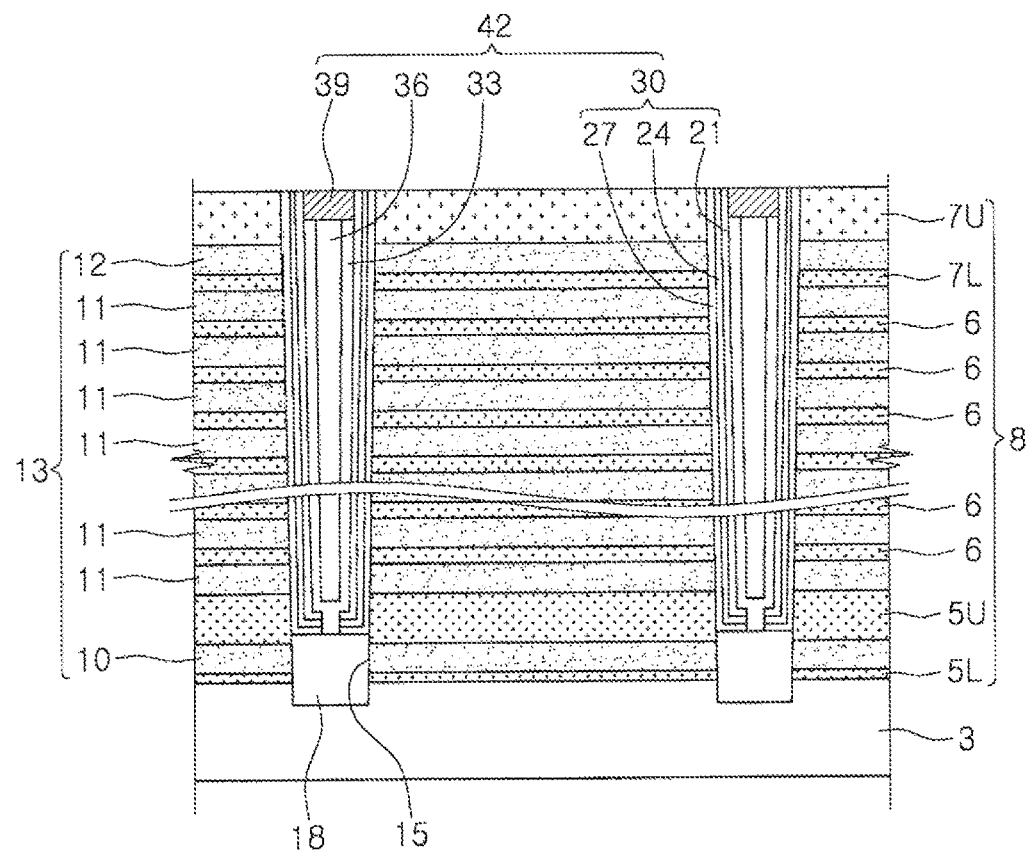

With reference to FIGS. 1 and 9D, a third dielectric layer 27 may be formed on the second dielectric layer 24. The third dielectric layer 27 may be a tunnel oxide layer. The first to third dielectric layers 21, 24 and 27 may be anisotropically etched to allow the semiconductor pattern 18 to be exposed. Subsequently, a semiconductor layer 33 may be formed. The semiconductor layer 33 may be formed of silicon. The semiconductor layer 33 may be connected to the semiconductor pattern 18.

A core pattern 36 partially filling the hole 15 may be formed above the semiconductor layer 33, a pad layer filling the remaining portion of the hole 15 and covering the semiconductor layer 33 may be formed, and a pad 39 may be formed by performing a planarization process to allow the second upper interlayer insulating layer 7U to be exposed.

The first to third dielectric layers 21, 24, and 27 may comprise a dielectric structure 30. The pad 39, the semiconductor layer 33, the core pattern 36, and the dielectric structure 30 may comprise a vertical structure 42. The vertical structure 42 may have an upper width in an upper region greater than a lower width in a lower region.

Figure 9E:
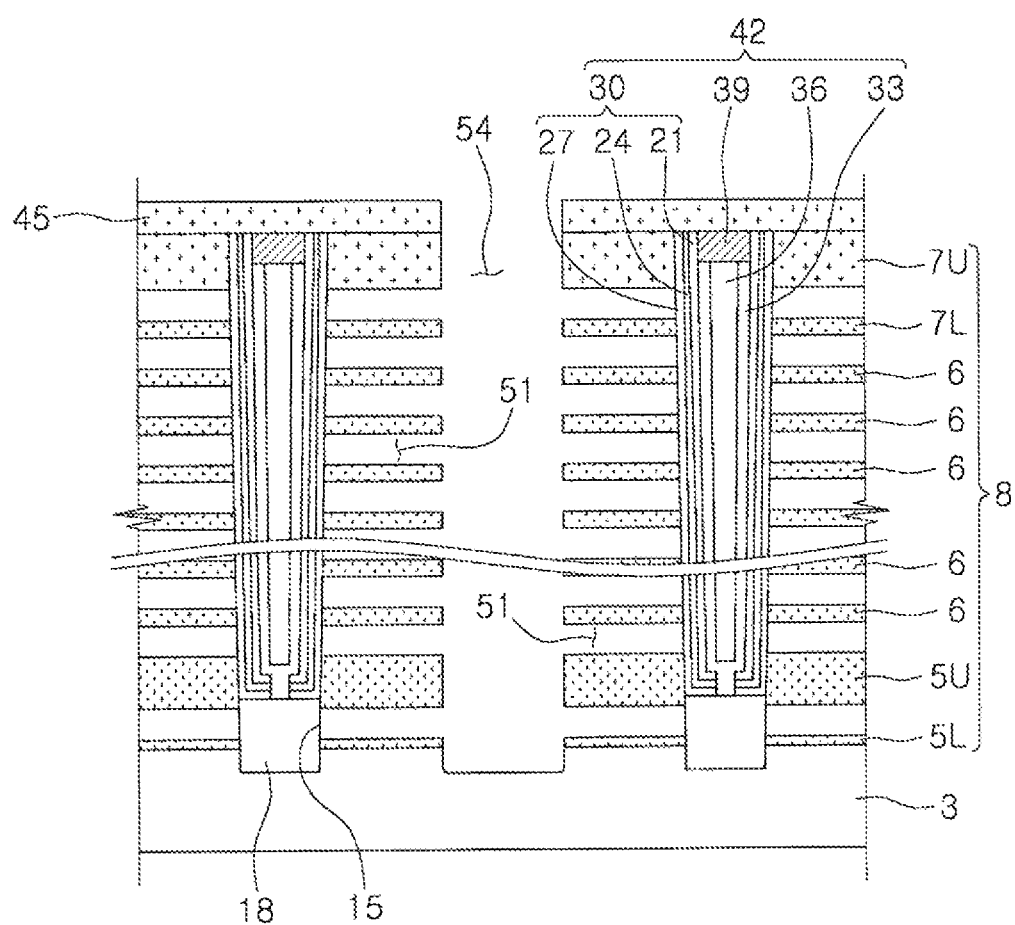

With reference to FIGS. 1 and 9E, a first upper insulating layer 45 covering the vertical structure 42 and the second upper interlayer insulating layer 7U may be formed. An isolation trench 54 penetrating through the first upper insulating layer 45, the interlayer insulating layers 8, and the sacrificial layers 13 may be formed. Subsequently, empty spaces 51 may be formed by selectively removing the sacrificial layers 13 exposed by the isolation trench 54.

Figure 9F:
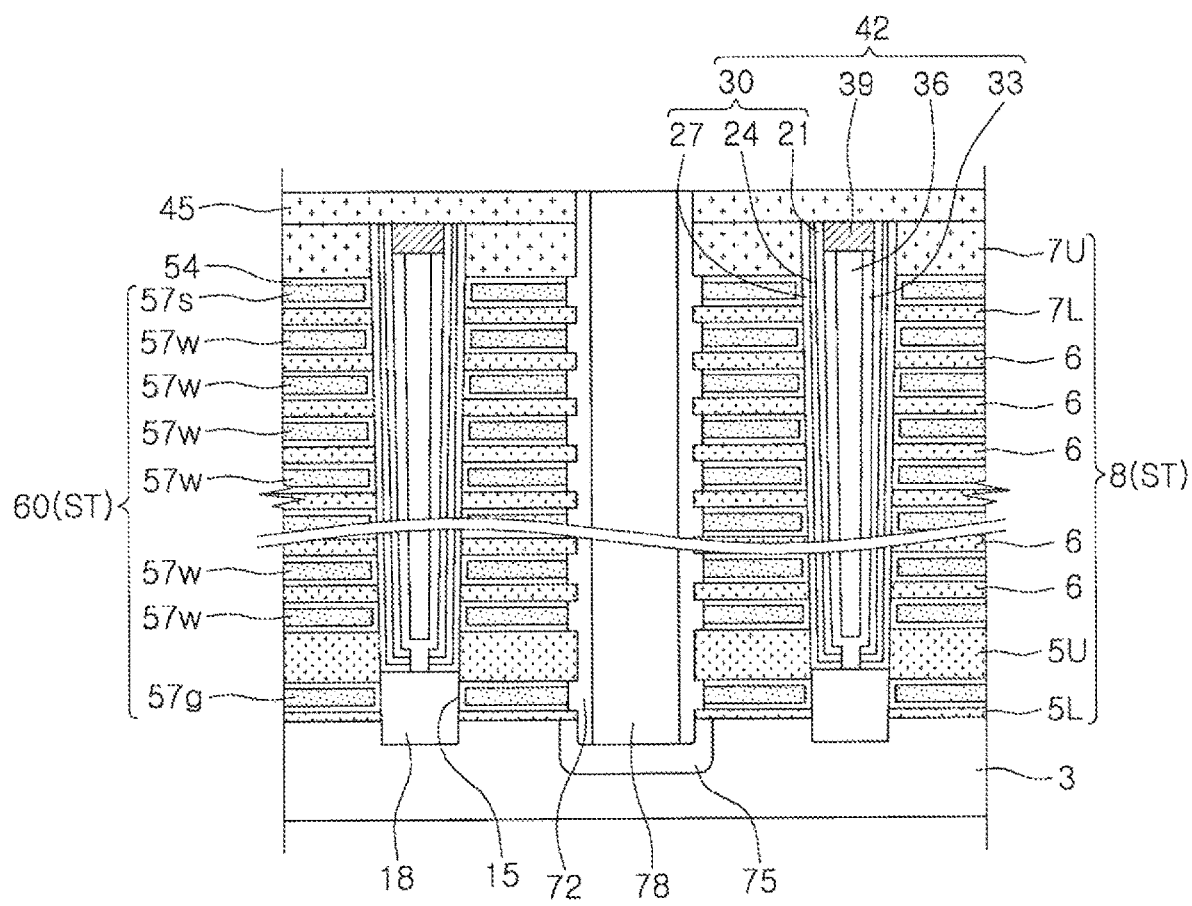

With reference to FIGS. 1 and 9F, fourth dielectric layers 54 and conductive patterns 60 may be formed in the empty spaces 51. Forming the fourth dielectric layers 54 and the conductive patterns 60 may include sequentially forming a dielectric layer and a conductive material layer in an upper portion of the substrate having the empty spaces 51 and etching back the conductive material layer. In an example, the dielectric layer may also be etched while etching back the conductive material layer.

The fourth dielectric layer 54 may be formed of a high-k dielectric, for example, hafnium oxide or aluminum oxide. The conductive patterns 60 may be formed of metal nitride, for example, TiN or the like, and/or a metal, for example, tungsten (W) or the like. The conductive patterns 60 may include select gate electrodes 57s and 57g and cell gate electrodes 57w as illustrated in FIGS. 1 to 3.

An insulating spacer 72 may be formed on sidewalls of the isolation trench 54 (see FIG. 9E). An impurity region 75 may be formed in a portion of the substrate 3, corresponding to a lower portion of the isolation trench 54 (see FIG. 9E), using, an ion implantation process. The impurity region 75 may be formed of an N-type conductivity material.

A separation pattern 78 filling the isolation trench 54 (FIG. 9E) may be formed. The separation pattern 78 may be formed of a conductive material, for example, any one of metal nitride, metal silicide, or a metal, or a combination thereof.

With reference to FIGS. 1 to 3, a second upper insulating layer 81 may be formed on the first upper insulating layer 45 and the separation pattern 78. The second upper insulating layer 81 may be formed of an insulating material, such as silicon oxide or the like. A contact plug 84, that may be electrically connected to the pad 39 of the vertical structure 42 while penetrating through the first and second upper insulating layers 45 and 81, may be provided. The contact plug 84 may be formed of metal-silicide, metal nitride and/or a metal. A bit line 87 electrically connected to the contact plug 84 may be disposed on the second upper insulating layer 81. The bit line 87 may be formed of a conductive material, for example, metal nitride, such as TiN or the like, and/or a metal, for example, tungsten (W) or the like.

Thus, a method of manufacturing a semiconductor device including the dielectric structure 30 may be provided. Thicknesses of the first to third dielectric layers 21, 24, and 27 of the dielectric structure 30 may refer to those in the illustration of FIG. 3, and are described above with reference to FIGS. 1 to 3.

A dielectric structure included in a semiconductor device according to an example embodiment is not limited to the dielectric structure 30 described above with reference to FIG. 3, but the semiconductor device may include a modified dielectric structure 30' described above with reference to FIG. 4. Thus, an example of a method of manufacturing a semiconductor device including a modified dielectric structure 30' (see FIG. 4) as described above will be described below with reference to FIGS. 10A to 10C.

Figure 10A:
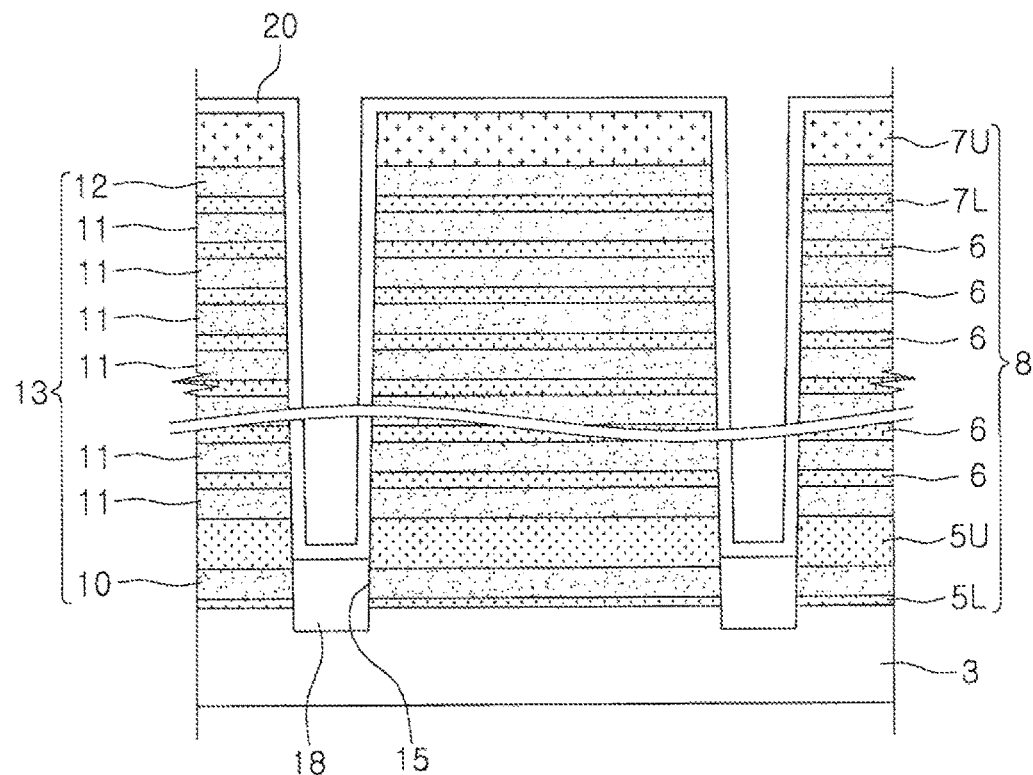
FIGS. 10A to 10C are cross-sectional views illustrating an example of a method of manufacturing a semiconductor device according to an example embodiment of the inventive concept.

With reference to FIG. 10A, as described above with reference to FIG. 9A, the interlayer insulating layers 8 and the sacrificial layers 13 may be alternately and repetitively formed on the substrate 3, the hole 15 may be formed to penetrate through the interlayer insulating layers 8 and the sacrificial layers 13, and the semiconductor pattern 18 may be formed in a lower region of the hole 15.

A first preliminary dielectric layer 20 may be formed in an upper portion of the substrate including the hole 15 and the semiconductor pattern 18. The first preliminary dielectric layer 20 may be formed of silicon oxide. The first preliminary dielectric layer 20 may have a decreasing thickness in a direction from an upper portion toward a lower portion thereof.

Figure 10B:
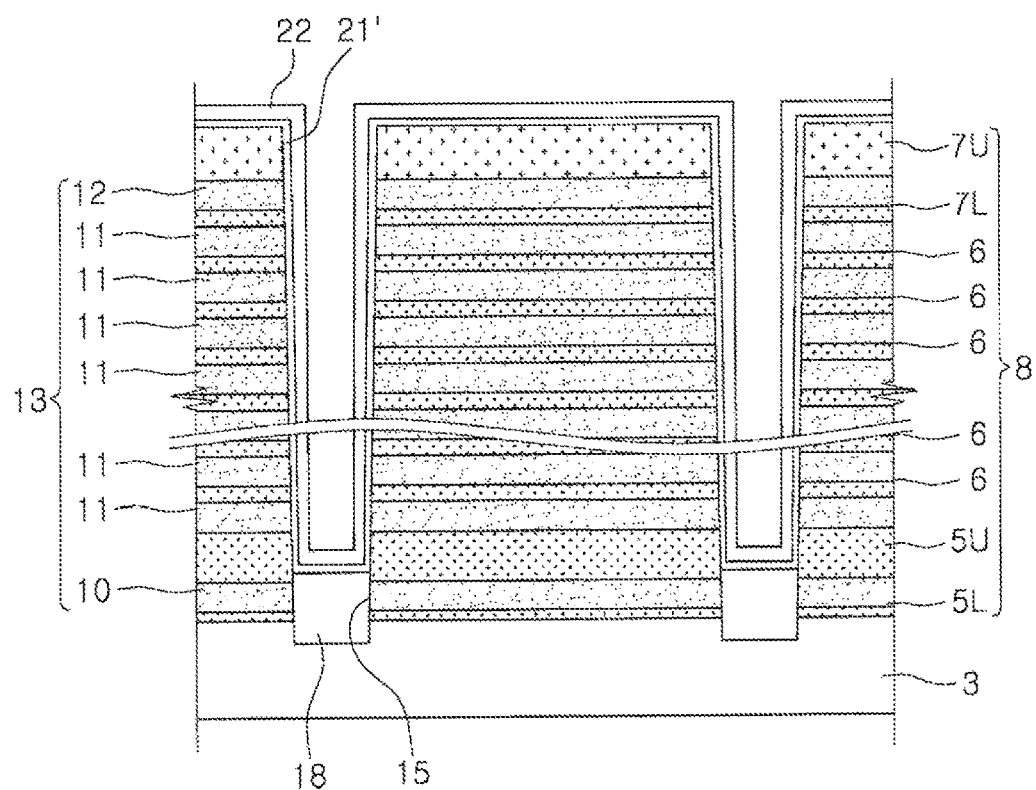

With reference to FIG. 10B, the first preliminary dielectric layer 20 (see FIG. 10A) may be nitrified to form a sacrificial insulating layer 22, and a first dielectric layer 21' having a thickness having been relatively reduced as compared to that of the first preliminary dielectric layer 20 (FIG. 10A) may be formed.

The first dielectric layer 21' may have a lower thickness Tl_1' (FIG. 4) in the lower region, greater than an upper thickness Tu_1' (FIG. 4) in the upper region as described above with reference to FIG. 4.

Figure 10C:
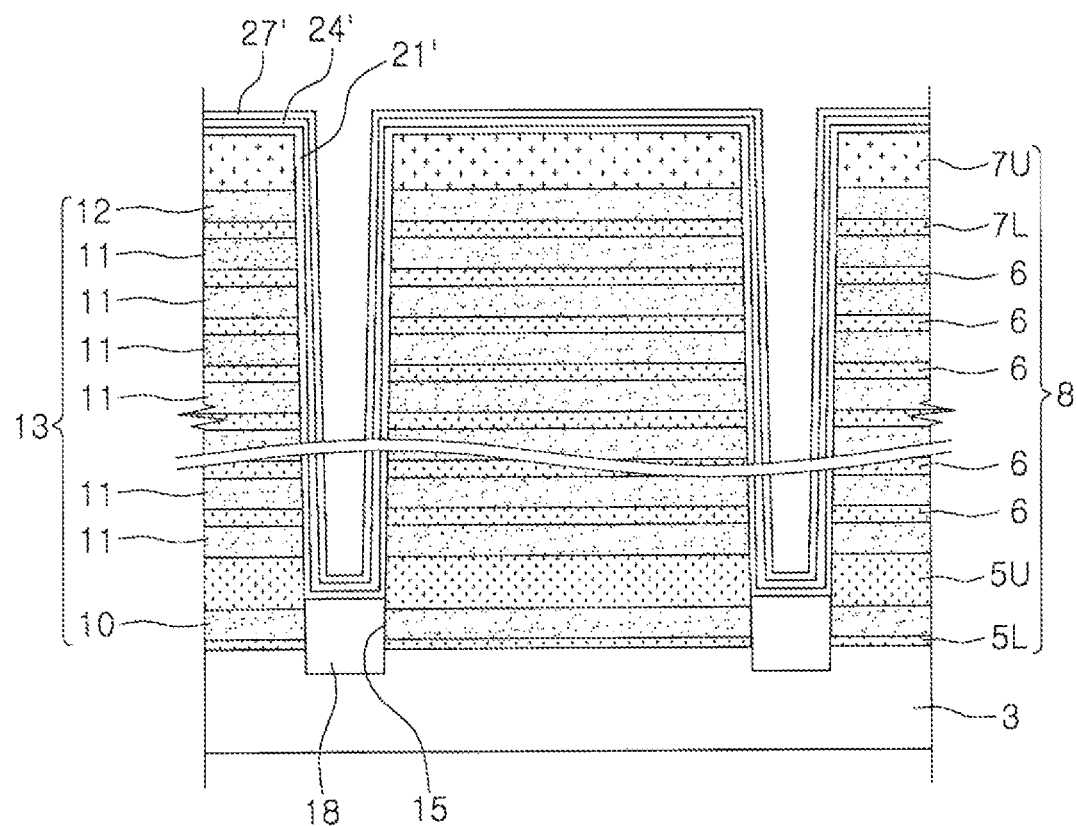

With reference to FIG. 10C, the sacrificial insulating layer 22 (see FIG. 10B) may be selectively removed using a wet etching process. Thus, the first dielectric layer 21' may be exposed. Subsequently, a second dielectric layer 24' and a third dielectric layer 27' may be sequentially formed.

Next, processes including the process of forming the vertical structure 42 described above with reference to FIG. 9D, and the process of forming the impurity region 75 and the separation pattern 78 described above with reference to FIG. 9F, may be performed.

The first to third dielectric layers 21', 24', and 27' may comprise the dielectric structure 30' as illustrated in FIG. 4. Thus, a method of manufacturing a semiconductor device including the dielectric structure 30' may be provided.

According to example embodiments, a structure of a semiconductor device in which cell distribution characteristics may be improved and a formation method thereof may be provided.

As set forth above, according to example embodiments, a semiconductor device in which cell distribution characteristics may be improved may be provided.

The foregoing is illustrative of embodiments of the inventive concept with reference to the accompanying drawings. Although a number of embodiments have been described, those of ordinary skill in the art will readily understand that many modifications are possible in embodiments without materially departing from the novel teachings and advantages. Therefore, it is to be understood that the foregoing is illustrative of various embodiments and is not to be construed as limited to the specific embodiments disclosed.

What is claimed is:

1. A semiconductor device comprising:
   a base region;
   a substrate on the base region;
   a peripheral circuit region between the base region and the substrate;
   a stack structure on the substrate; and
   a vertical structure within the stack structure,
   wherein the stack structure comprises cell gate electrodes and interlayer insulating layers alternately stacked on the substrate,
   wherein the cell gate electrodes comprise a lower cell gate electrode, an upper cell gate electrode on the lower cell gate electrode, and a plurality of intermediate cell gate electrodes between the lower cell gate electrode and the upper cell gate electrode,
   the vertical structure comprises a lower region opposite to the lower cell gate electrode, an intermediate region opposite to the plurality of intermediate cell gate electrodes, and an upper region opposite to the upper cell gate electrode,
   wherein the lower region of the vertical structure has a first width and the upper region of the vertical structure has a second width, greater than the first width, and
   wherein the vertical structure further comprises two dielectric layers of which respective ratios of lower thicknesses in the lower region of the vertical structure to upper thicknesses in the upper region of the vertical structure are different from each other, and
   wherein respective thicknesses of the two dielectric layers of the vertical structure monotonically change from the upper region of the vertical structure to the lower region of the vertical structure.

2. The semiconductor device of claim 1, wherein a first one of the two dielectric layers has a lower thickness in the lower region greater than an upper thickness in the upper region, and a second one of the two dielectric layers has a lower thickness in the lower region less than an upper thickness in the upper region.

3. The semiconductor device of claim 1, wherein the vertical structure further comprises a tunnel oxide layer, a charge trapping layer, and a blocking layer, the charge trapping layer being disposed between the tunnel oxide layer and the blocking layer;

a first one of the two dielectric layers is the charge trapping layer, and a second one of the two dielectric layers is the blocking layer, and each of the two dielectric layers is integrally and continuously formed from the lower region to the upper region.

4. The semiconductor device of claim 3, wherein the vertical structure further comprises a semiconductor layer, the tunnel oxide layer is adjacent to the semiconductor layer, and the blocking layer is adjacent to the stack structure.

5. A semiconductor device comprising:
a base region;
a substrate on the base region;
a peripheral circuit region between the base region and the substrate;
conductive patterns and interlayer insulating layers alternately stacked on a substrate; and
a vertical structure disposed in a hole that penetrates through the conductive patterns and the interlayer insulating layers,
wherein the conductive patterns comprise a lower conductive pattern and an upper conductive pattern on the lower conductive pattern,
wherein the conductive patterns comprise a lower conductive pattern, an upper conductive pattern on the lower conductive pattern, and a plurality of intermediate conductive patterns between the lower conductive pattern and the conductive pattern,
wherein the vertical structure comprises a lower region opposite to the lower conductive pattern, an intermediate region opposite to the plurality of intermediate conductive patterns, and an upper region opposite to the upper conductive pattern, the upper region having a width greater than a width of the lower region,
wherein the vertical structure comprises a semiconductor layer and a dielectric structure adjacent to the conductive patterns,
wherein the dielectric structure comprises a layer having a first portion and a second portion,
wherein the first portion of the layer is located at the same level as an upper surface of the lower conductive pattern,
wherein the second portion of the layer is located at the same level as an upper surface of the upper conductive pattern, and
wherein a first thickness of the first portion of the layer is greater than a second thickness of the second portion of the layer.

6. The semiconductor device of claim 5, wherein the layer is a first layer,
wherein the dielectric structure comprises a second layer,
wherein the second layer comprises a third portion and a fourth portion,
wherein the third portion of the second layer is located at the same level as an upper surface of the lower conductive pattern,
wherein the fourth portion of the second layer is located at the same level as an upper surface of the upper conductive pattern, and
wherein a third thickness of the third portion of the second layer is smaller than a fourth thickness of the fourth portion of the second layer.

7. The semiconductor device of claim 5, wherein the dielectric structure further comprises a first dielectric layer, a second dielectric layer, and a third dielectric layer,
the second dielectric layer is interposed between the first dielectric layer and the third dielectric layer,
the first dielectric layer is adjacent to the conductive patterns, and
the layer, of which the first thickness is greater than the second thickness, is one of the first dielectric layer and the second dielectric layer.

8. The semiconductor device of claim 7, wherein another one of the first and second dielectric layers comprises a third portion and a fourth portion,
wherein the third portion is located at the same level as an upper surface of the lower conductive pattern,
wherein the fourth portion is located at the same level as an upper surface of the upper conductive pattern, and
wherein a third thickness of the third portion of the second layer is smaller than a fourth thickness of the fourth portion of the second layer.

9. The semiconductor device of claim 7, wherein the layer, of which the first thickness is greater than the second thickness, is the second dielectric layer.

10. The semiconductor device of claim 5, further comprising a semiconductor pattern disposed in the hole between the vertical structure and the substrate,
wherein a side of the semiconductor pattern faces a side of a lowermost conductive pattern among the conductive patterns, and
wherein the semiconductor pattern is connected to the semiconductor layer, and
wherein the lower conductive pattern is on the lowermost conductive pattern.

11. The semiconductor device of claim 5, further comprising a bit line on the vertical structure,
wherein the vertical structure further comprises a core pattern and a pad on the core pattern,
wherein a side and a bottom surface of the core pattern are covered by the semiconductor layer, and
wherein the bit line is electrically connected to the pad.

12. The semiconductor device of claim 5, further comprising:
a base below the substrate; and
a peripheral circuit between the base and the substrate.

13. A semiconductor device, comprising:
a base region;
a substrate on the base region;
a peripheral circuit region between the base region and the substrate;
a stack structure on the substrate having an opening formed therein, wherein the stack structure comprises cell gate electrodes and interlayer insulating layers alternately stacked on the substrate; and
a vertical structure in the opening and comprising layers;
wherein the cell gate electrodes comprise a lower cell gate electrode, an upper cell gate electrode, and a plurality of intermediate cell gate electrodes between the lower cell gate electrode and the upper cell gate electrode,
wherein the each of the layers has an upper region opposite to the upper cell gate electrode, a lower region opposite to the lower cell gate electrode, and an intermediate region between the upper region and the lower region,
wherein the intermediate region is opposite to the plurality of intermediate cell gate electrodes,
wherein a first ratio of a thickness of the lower region to a thickness of the upper region for a first one of the layers is different from a second ratio of a thickness of the lower region to a thickness of the upper region for a second one of the layers, wherein respective thicknesses of the layers monotonically change between the lower region and the upper region, and wherein the each of the layers is integrally and continuously formed from the lower region to the upper region.

14. The semiconductor device of claim 13, wherein the first ratio is less than one, the second ratio is greater than one; and wherein a third ratio of a thickness of the lower region to a thickness of the upper region for a third one of the layers is less than one.

15. The semiconductor device of claim 14, wherein the second one of the layers is between the first one of the layers and the third one of the layers.

16. The semiconductor device of claim 14, wherein the second one of the layers is between the stack structure and the first and third ones of the layers.

17. The semiconductor device of claim 13, wherein the vertical structure further comprises:

a semiconductor layer on a sidewall of the vertical structure opposite the stack structure;

wherein the semiconductor device further comprises:

a semiconductor pattern between the vertical structure and the substrate and being in contact with the semiconductor layer.

18. The semiconductor device of claim 13, wherein the layers further comprise a third one, wherein the second one of the layers is between the first one of the layers and the third one of the layers, wherein the first one of the layers is a blocking dielectric layer, wherein the second one of the layers is a charge trapping layer, wherein the third one of the layers is a tunnel dielectric layer, and wherein a thickness of the charge trapping layer monotonically changes between the lower region and the upper region.

19. The semiconductor device of claim 1, wherein a first layer of the two dielectric layers has a first portion and a second portion, wherein the first portion of the first layer is located at the same level as an upper surface of the lower cell gate electrode, wherein the second portion of the first layer is located at the same level as an upper surface of the upper cell gate electrode, and wherein a first thickness of the first portion of the first layer is greater than a second thickness of the second portion of the first layer.

20. The semiconductor device of claim 13, wherein a first layer of the layers has a first portion and a second portion, wherein the first portion of the first layer is located at the same level as an upper surface of the lower conductive pattern, wherein the second portion of the first layer is located at the same level as an upper surface of the upper conductive pattern, and wherein a first thickness of the first portion of the first layer is greater than a second thickness of the second portion of the first layer.

* * * * *